(12) United States Patent
Mieher et al.

(10) Patent No.: US 9,030,661 B1
(45) Date of Patent: May 12, 2015

(54) ALIGNMENT MEASUREMENT SYSTEM

(71) Applicant: KLA-Tencor Corporation, Milpitas, CA (US)

(72) Inventors: Walter D. Mieher, Los Gatos, CA (US); Michael R. Gluszczak, San Jose, CA (US); Joseph A. DiRegolo, Livermore, CA (US)

(73) Assignee: KLA-Tencor Corporation, Milpitas, CA (US)

( * ) Notice: Subject to any disclaimer, the term of this patent is extended or adjusted under 35 U.S.C. 154(b) by 0 days.

(21) Appl. No.: 14/161,549

(22) Filed: Jan. 22, 2014

Related U.S. Application Data

(60) Provisional application No. 61/798,449, filed on Mar. 15, 2013.

(51) Int. Cl.
*G01B 11/00* (2006.01)
*G01B 11/14* (2006.01)
*G03F 9/00* (2006.01)

(52) U.S. Cl.
CPC .............. *G01B 11/14* (2013.01); *G03F 9/7088* (2013.01); *G03F 9/7046* (2013.01); *G03F 9/7003* (2013.01); *G03F 9/7069* (2013.01)

(58) Field of Classification Search
None
See application file for complete search history.

(56) References Cited

U.S. PATENT DOCUMENTS

| | | | |
|---|---|---|---|
| 4,251,160 A | 2/1981 | Bouwhuis et al. | |
| 4,828,392 A | 5/1989 | Nomura et al. | |
| 5,144,363 A | 9/1992 | Wittekoek et al. | |
| 6,297,876 B1 * | 10/2001 | Bornebroek | 355/67 |
| 6,469,793 B1 * | 10/2002 | Stanton | 356/521 |
| 6,844,918 B2 | 1/2005 | Navarro Y Koren et al. | |
| 7,271,907 B2 * | 9/2007 | Van Bilsen | 356/401 |
| 8,593,646 B2 * | 11/2013 | Den Boef et al. | 356/614 |
| 2007/0222990 A1 * | 9/2007 | Musa et al. | 356/401 |
| 2009/0153825 A1 * | 6/2009 | Edart et al. | 355/67 |

OTHER PUBLICATIONS

D. C. Flanders, et al. "A new interferometric alignment technique", Jun. 17, 1977, published Jul. 15, 1977, pp. 426-428, AIP Applied Physics Letters, vol. 31, No. 7, Oct. 1, 1977.

* cited by examiner

*Primary Examiner* — Gordon J Stock, Jr.
(74) *Attorney, Agent, or Firm* — Okamoto & Benedicto LLP

(57) ABSTRACT

One embodiment relates to an apparatus for alignment measurement. A laser source generates an incident laser beam which is directed to a two-dimensional target grating on a target substrate such that multiple diffracted beams are created. A beam splitter transmits a first plurality of the multiple diffracted beams onto a first optical path and directs a second plurality of the multiple diffracted beams onto a second optical path. Each of the two optical paths includes a reference grating and a detector. Another embodiment relates to a method of measuring alignment of a target substrate. Other embodiments, aspects and features are also disclosed.

20 Claims, 5 Drawing Sheets

400

410

420

430

ALIGNMENT MEASUREMENT SYSTEM

CROSS-REFERENCE TO RELATED APPLICATION(S)

The present application claims the benefit of U.S. Provisional Application No. 61/798,449, filed Mar. 15, 2013, entitled "Alignment Measurement System," the disclosure of which is hereby incorporated by reference.

STATEMENT REGARDING FEDERALLY SPONSORED RESEARCH OR DEVELOPMENT

This invention was made with Government support under Agreement No. HR0011-07-9-0007 awarded by DARPA. The Government has certain rights in the invention.

BACKGROUND OF THE INVENTION

1. Field of the Invention

The present invention relates to an alignment measurement system which accurately and precisely measures the location of alignment marks on a manufactured substrate.

2. Description of the Background Art

Phase-grating interference, as a principle, has been used for reticle and wafer position detection for stepper alignment systems. See, for example: S. Austin, et al., Applied Physics Letters, Vol. 31, p. 426 (1977); U.S. Pat. No. 4,251,160 (1978); U.S. Pat. No. 4,828,392 (1989); U.S. Pat. No. 5,144,363; and U.S. Pat. No. 6,844,914 (2005).

SUMMARY

One embodiment relates to an apparatus for alignment measurement. A laser source generates an incident laser beam which is directed to a two-dimensional target grating on a target substrate such that multiple diffracted beams are created. A beam splitter transmits a first plurality of the multiple diffracted beams onto a first optical path and directs a second plurality of the multiple diffracted beams onto a second optical path. Each of the two optical paths includes a reference grating and a detector.

Another embodiment relates to a method of measuring alignment of a target substrate. An incident laser beam is generated and directed to a two-dimensional target grating on the target substrate such that multiple diffracted beams are created. A first plurality of the multiple diffracted beams is transmitted onto a first optical path, and a second plurality of the multiple diffracted beams is deflected onto a second optical path. The first plurality of the multiple diffracted beams is focused onto a first reference grating which generates a first diffraction, and the second plurality of the multiple diffracted beams is focused onto a second reference grating which generates a second diffraction.

Another embodiment relates to an alignment measurement system. The system includes at least a two-dimensional target grating on a target substrate, a laser source, a beam splitter, first and second reference gratings, and first and second detectors. The target grating has features spaced apart periodically along two dimensions. The laser source generates an incident laser beam which is directed to the two-dimensional target grating such that multiple diffracted beams are created. The beam splitter directs a first plurality of the multiple diffracted beams onto a first optical path and directs a second plurality of the multiple diffracted beams onto a second optical path. The first reference grating and the first detector are in a first optical path and are used to measure alignment in a first dimension, and the second reference grating and the second detector are in a second optical path and are used to measure alignment in a second dimension.

Other embodiments, aspects and features are also disclosed.

DETAILED DESCRIPTION

Alignment Mark Position Measurements

The present disclosure provides a system and method to accurately and precisely measure the positions of alignment marks, such as those which may be formed on a manufactured substrate, such as a reticle or a semiconductor wafer. For example, the positions of the alignment marks may be measured with well-defined ideal nominal wafer grid coordinates that can be accurately translated to the stage metrology system coordinates. Such alignment measurements may be used, for example, in a reflection electron beam lithography system to measure the position of the wafer alignment marks and other features to allow for overlay control.

The alignment marks whose positions are to be measured may be part of a target substrate (such as a reticle or wafer) to be processed (wafer alignment marks), or part of the electron beam (e-beam) position detection system, such as the electron beam transmission stencil or electron backscatter targets (e-beam sensor alignment marks). Other alignment marks may be marks on the stage spokes, the wafer chuck, or the wafer stage (stage or chuck alignment marks).

Wafer alignment marks are features that may be patterned onto a wafer, and wafer alignment mark position measurements may be used to calculate the positions of these previously-patterned features on the wafer. Wafer alignment marks may be used to determine a new exposure placement pattern to minimize overlay error between the new features and the existing circuit features.

E-beam sensor alignment marks may be used to establish the position of the e-beam. The position of the e-beam may be established in the stage metrology coordinates so that the e-beam position on the surface of the target substrate may be calculated accurately.

The positions of stage or wafer chuck alignment marks may be measured to establish and track the relationship between the stage alignment mark measurements and the stage position metrology system. The stage position metrology system may use an interferometer, an encoder, or combination of both.

Alignment Measurement System

Figure 1:
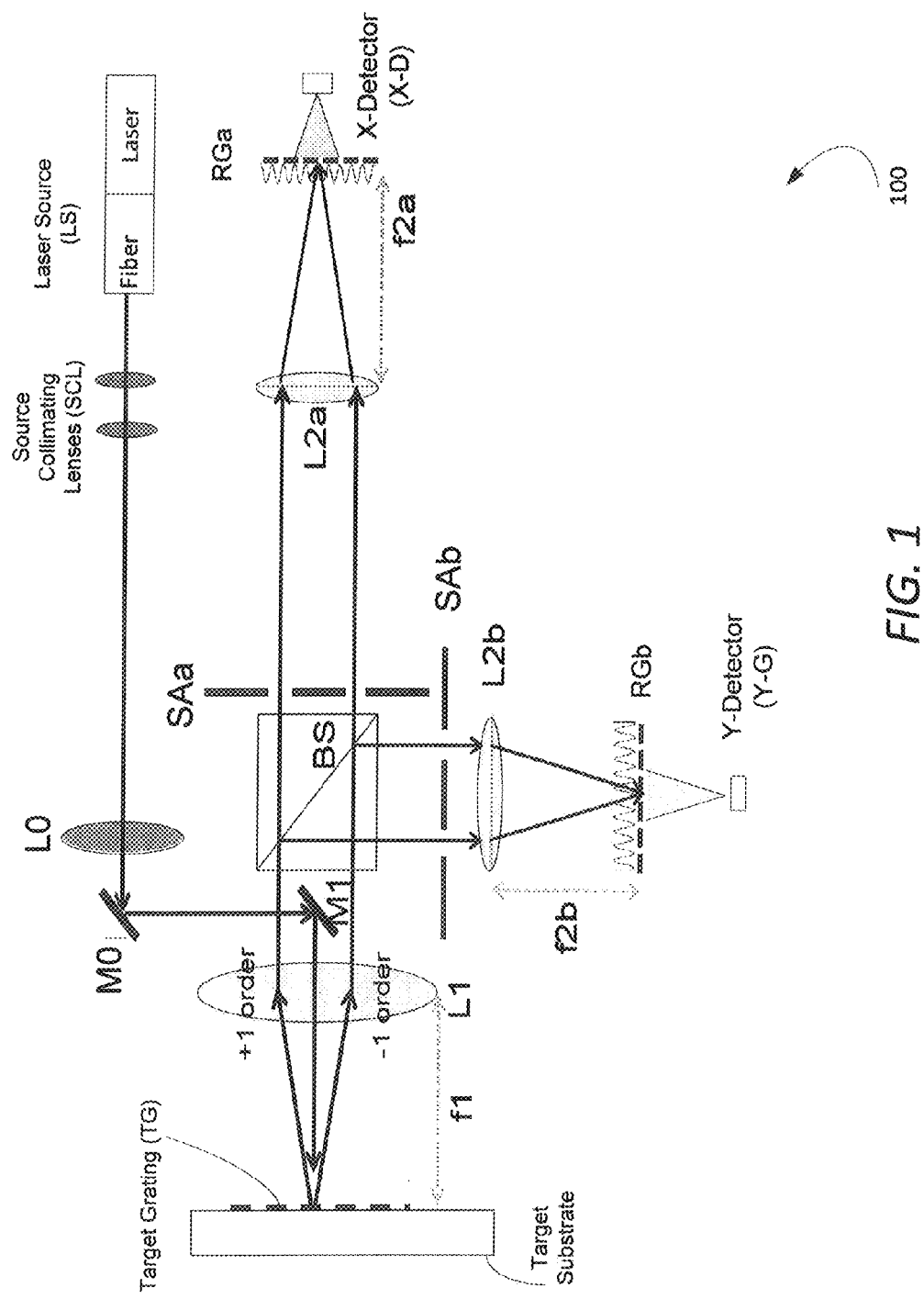
FIG. 1 depicts an alignment measurement system in accordance with an embodiment of the present invention.

FIG. 1 depicts an alignment measurement system 100 in accordance with an embodiment of the present invention. A laser source (LS) includes a laser which generates a laser beam and an optical fiber which directs the laser beam to source collimating lenses (SCL). The source collimating lenses collimates the laser beam exiting the optical fiber to provide an incident laser beam. Beam steering optics, such as a steering lens (L0) and mirrors (M0 and M1), direct the collimated laser beam through the center of a collection lens (L1) at normal incidence to the surface of the target substrate (such as a semiconductor wafer, for example).

The target objective lens focuses the incident laser beam onto a target grating (TG) on the surface of the target substrate. This results in reflected and diffracted laser beams traveling back to the collection lens L1.

Note that example +1 order and −1 order diffracted beams are shown in one-dimension for purposes of illustration in FIG. 1. However, if the target grating is two-dimensional, then the diffracted beams would also, of course, be in two dimensions.

The collection lens L1 is positioned at focal length f1 from the surface of the target substrate. The collection lens collects and collimates the diffracted and reflected beams. In this embodiment, the reflected beam travels back along the incident beam path. The reflected beam can be ejected from the optical path with an optical isolator (not shown).

Figure 3:
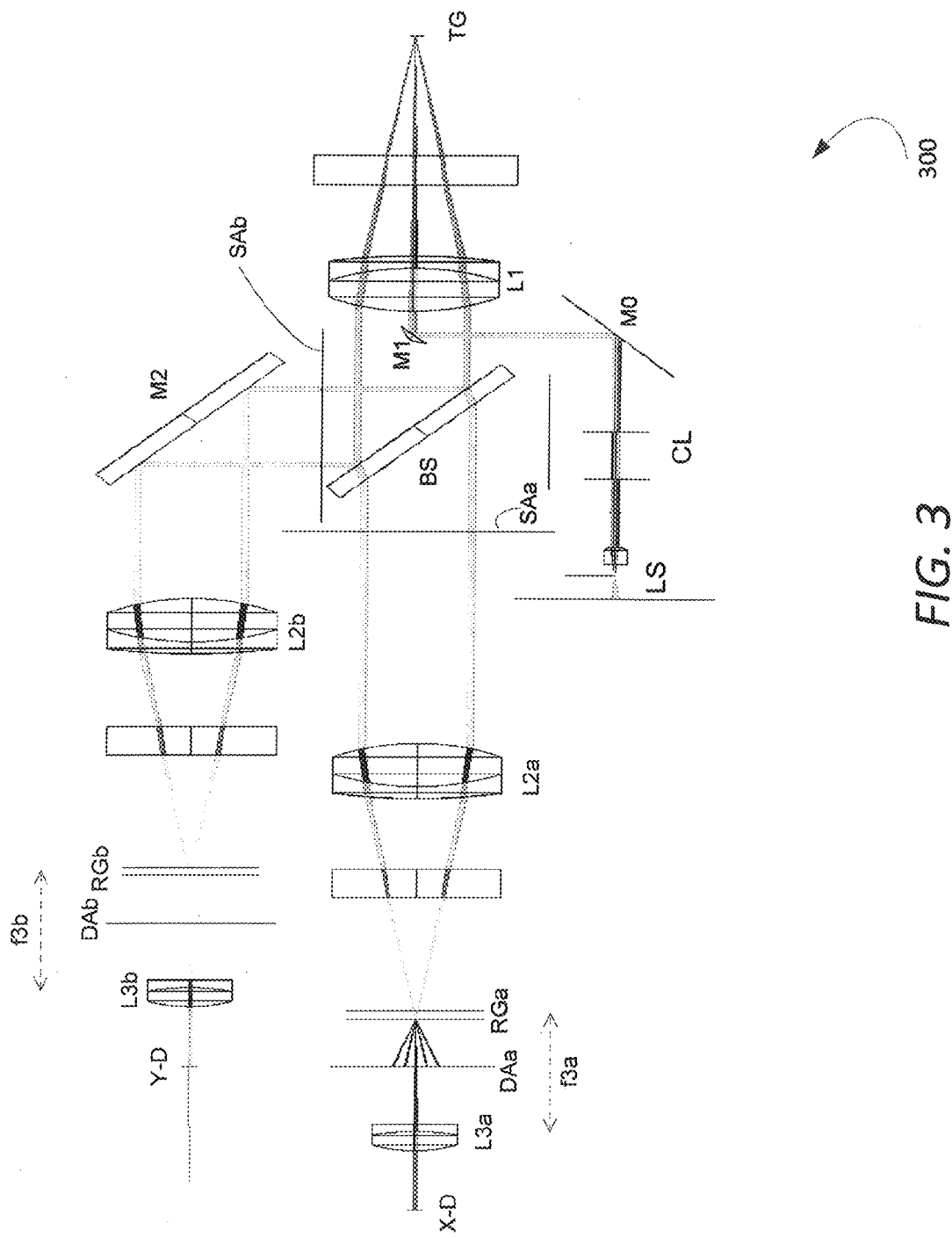
FIG. 3 depicts an alignment measurement system in accordance with an alternate embodiment of the present invention.

The beam splitter (BS) divides the collected diffracted beams into two optical paths to be used for determining the position of phase grating alignment marks of different orientations (i.e. along different dimensions, such as, for example, the x-dimension and the y-dimension). In the example depicted, the beam splitter directs the diffracted beams to a first path (path a) and a second path (path b). As depicted, the BS may be implemented, for example, using a cube beam splitter (FIG. 1) or a plate beam splitter (FIG. 3).

A selection aperture may be used in each optical path to select (filter) diffraction orders to be detected by the detector for that path. Alternatively, optical elements (wedges, mirrors, or lenslets) may be used to steer and separate diffraction orders. In the depicted embodiment, a pair of +1 and −1 diffraction orders may be selected for each path, and the other diffraction orders may be filtered out.

The first selection aperture (SAa) on the first path selects diffraction orders in (or near) the Fourier plane between the collection lens L1 and a first focusing lens L2a. Similarly, the second selection aperture (SAb) on the second path selects diffraction orders in (or near) the Fourier plane between the collection lens L1 and a second focusing lens L2b.

In an exemplary implementation, the optical distance from L1 to SAa is the focal length f1 (the focal length of lens L1), and the optical distance from L1 to SAb is also the focal length f1. The distance from SAa to L2a may be the focal length f2a (the focal length of lens L2a), and the distance from SAb to L2b may be the focal length f2b (the focal length of lens L2b). In one particular implementation, f1=f2a=f2b. In another implementation, f2a=f2b, and f1 may be a different length. In other implementations, f1, f2a and f2b may be different lengths.

Note that, for purposes of illustration, the diagram in FIG. 1 depicts only two diffracted beams (+1 order and −1 order) that are diffracted in one dimension. However, the actual system would have further diffracted beams that are diffracted in two dimensions. For example, as indicated in FIG. 1, the +1 order and −1 order beams that are diffracted in the x-dimension may pass through the first selection aperture (SAa) on the first optical path, and the +1 order and −1 order beams that are diffracted in the y-dimension may pass through the second selection aperture (SAb) on the second optical path.

The first focusing lens L2a may focus a first pair of diffraction orders (for example, +1 and −1 order beams diffracted in the x-dimension) to a focus point on a first reference grating (RGa) before a first detector (X-Detector or X-D) at the end of the first optical path. RGa may be a one-dimensional grating with grating lines spaced apart in the x-direction.

Similarly, the second focusing lens L2b may focus a second pair of diffraction orders (for example, +1 and −1 order beams diffracted in the y-dimension) to a focus point on a second reference grating (RGb) before a second detector (Y-Detector or Y-D) at the end of the second optical path. RGb may be a one-dimensional grating with grating lines spaced apart in the y-direction.

For the case where f1=f2a, the period of RGa in the x-dimension may be the same as the period of TG in the x-dimension. Similarly, for the case where f1=f2b, the period of RGb in the y-dimension may be the same as the period of TG in the y-dimension. More generally, the period of RGa in the x-dimension may be based on the ratio f1/f2a and the period of TG in the x-dimension, and the period of RGb in the y-dimension may be based on the ratio f1/f2b and the period of TG in the y-dimension.

Figure 2:
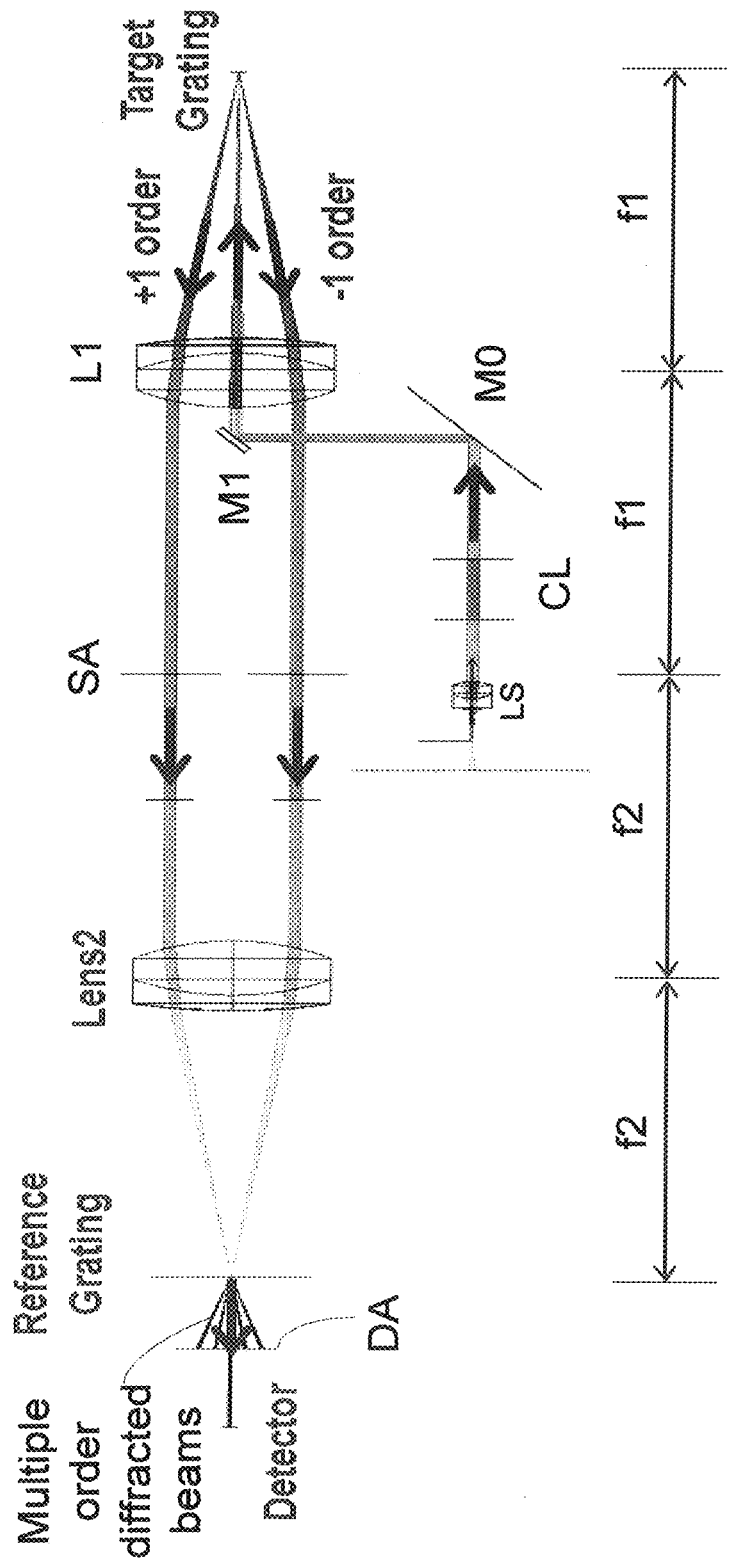
FIG. 2 is a Zemax layout of the system showing the multiple diffraction orders of the system in accordance with an embodiment of the invention. For clarity of illustration, the beam splitter is not shown in FIG. 2.

Referring to FIG. 2, one optical path of the system 100 is shown in a Zemax layout. The SA, Lens2, focal length f2, Reference Grating and Detector corresponds, respectively, to SAa, L2a, f2a, RGa and X-D in the first path and to SAb, L2b, f2b, RGb and Y-D in the second path.

As depicted in FIG. 2, the two beams incident on the reference grating undergo diffraction and so results in multiple orders of diffraction beams. Each incident beam has corresponding transmitted 0, ±1, . . . ±n order diffraction beams.

When the system is correctly aligned and focused, two diffraction beams (one from each incident beam) traveling along an optical axis in a center position of the detector are superimposed and coaxial, with a phase difference depending on the position of the target grating with respect to the reference grating. These superposed center beams interfere and their combined intensity is read with a detector and electronics. The first center beam is the +1 order diffraction beam result from diffraction on the reference grating of the +1 order incident beam from the target grating (e.g., from the wafer alignment mark). The second center beam is the −1 order diffraction beam result from diffraction on the reference grating of the −1 order incident beam from the target grating.

The other diffraction beams may be blocked with a detector aperture (shown as DAa and DAb in FIG. 3) in front of each detector. An additional collimating lens (shown as L3a and L3b in FIG. 3) may also used between the reference grating and the detector. The additional collimating lens may be positioned at a focal length (shown as f3a and f3b in FIG. 3) from the reference grating to change the interfering beams from spherical wave-front to plane wave-front on the detector.

FIG. 3 depicts an alignment measurement system 300 in accordance with an alternate embodiment of the present invention. One difference between the alignment measurement system 100 of FIG. 1 and the alignment measurement system 300 of FIG. 3 is the folding mirror (M2) in FIG. 3. The folding mirror M2 deflects the beams in the second optical path so that the two optical paths become parallel (from BS to X-D in the first path and from M2 to Y-D in the second path). This advantageously enables a more compact design. Another difference is that a plate beam splitter is used for the BS in FIG. 3, while a cube beam splitter is used for the BS in FIG. 1. The cube or plate beam splitter may be a 50/50 beam splitter in that 50% of the light intensity may be transmitted to the first path and 50% of the light intensity may be reflected to the second path.

In accordance with an alternate embodiment of the invention, a partially-mirrored plate beam splitter may be used to separate the beams from the different grating orientations onto the two paths. The mirror regions may be formed, for example, by forming a reflective coating onto the surface of a plate beam splitter. Advantageously, such a partially-mirrored plate beam splitter may be configured to send more signal to the detectors than a 50/50 beam splitter combined with selective apertures.

Figure 4A:
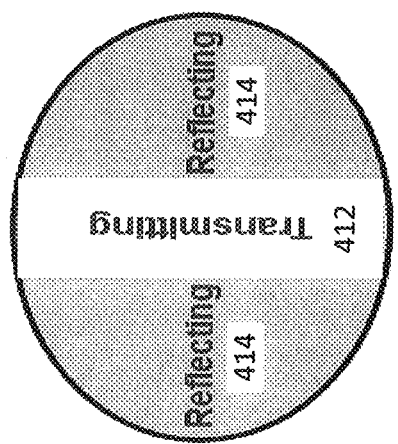
FIGS. 4A, 4B, 4C and 4D depict windowed reflectors which may be used for a beam splitter in accordance with embodiments of the invention.
Figure 4B:
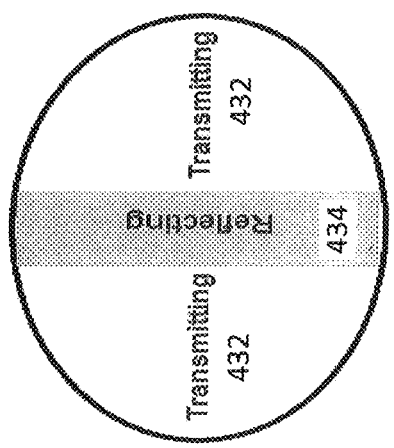
Figure 4C:
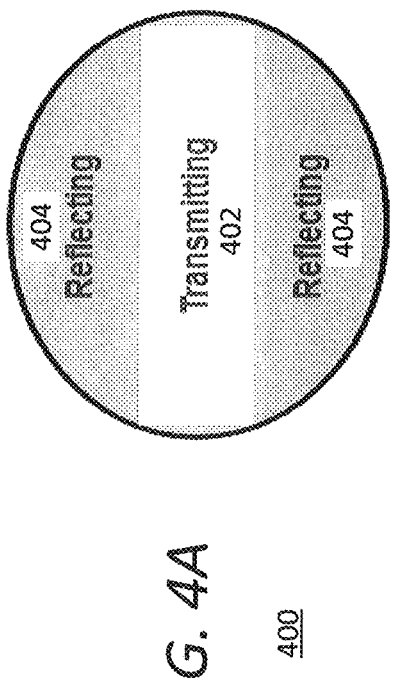
Figure 4D:
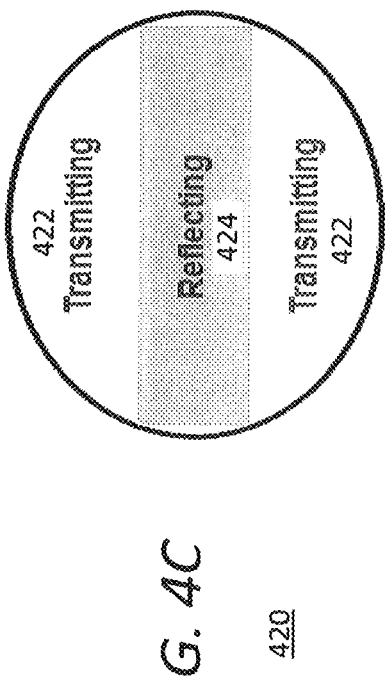
Figure 5B:
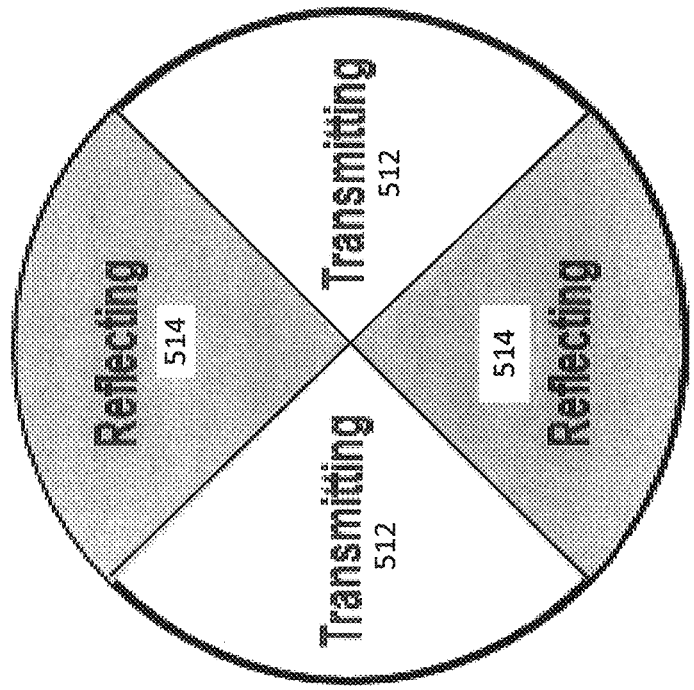
FIGS. 5A and 5B depict further windowed reflectors which may be used for a beam splitter in accordance with embodiments of the invention.

To implement a plate beam splitter where x-dimension information is transmitted and y-dimension information is reflected (such as shown in FIGS. 1 and 3), the plate beam splitter may utilize the partially-reflecting mirror 400 depicted in FIG. 4A, or the partially-reflecting mirror 430 depicted in FIG. 4D, or the partially-reflecting mirror 510 depicted in FIG. 5B.

The partially-reflecting mirror 400 of FIG. 4A has a transmitting (transparent) region 402 along the x-axis and reflecting (mirrored) regions 404 above and below the transmitting region 402. The transmitting region 402 allows the beams diffracted along the x-dimension to continue to travel along the first path (path a), while the reflecting regions 404 reflects the beams diffracted along the y-dimension so that it travels along the second path (path b).

The partially-reflecting mirror 430 of FIG. 4D has a reflecting (mirrored) region 434 along the y-axis and transmitting (transparent) regions 432 to the right and left of the reflecting region 434. The reflecting region 434 reflects the beams diffracted along the y-dimension so that it travels along the second path (path b), while the transmitting regions 432 allows the beams diffracted along the x-dimension to continue to travel along the first path (path a).

The partially-reflecting mirror 510 of FIG. 5B has a first transmitting (transparent) pie-wedge-shaped region 512 covering from −45 degrees to +45 degrees, a second transmitting pie-wedge-shaped region 512 covering from +135 degrees to −135 degrees, a first reflecting (mirrored) pie-wedge-shaped region 514 covering from +45 degrees to +135 degrees, a second reflecting pie-wedge-shaped region 514 covering from −45 degrees to −135 degrees. (Note that, in FIGS. 5A and 5B, 0 or +360 degrees defines the position of the positive x-axis, +90 or −270 degrees defines the position of the positive y-axis, +180 or −180 degrees defines the position of the negative x-axis, and +270 or −90 degrees defines the position of the negative y-axis.) The transmitting regions 512 allows the beams diffracted along the x-dimension to continue to travel along the first path (path a), while the reflecting regions 514 reflects the beams diffracted along the y-dimension so that it travels along the second path (path b).

Figure 5A:
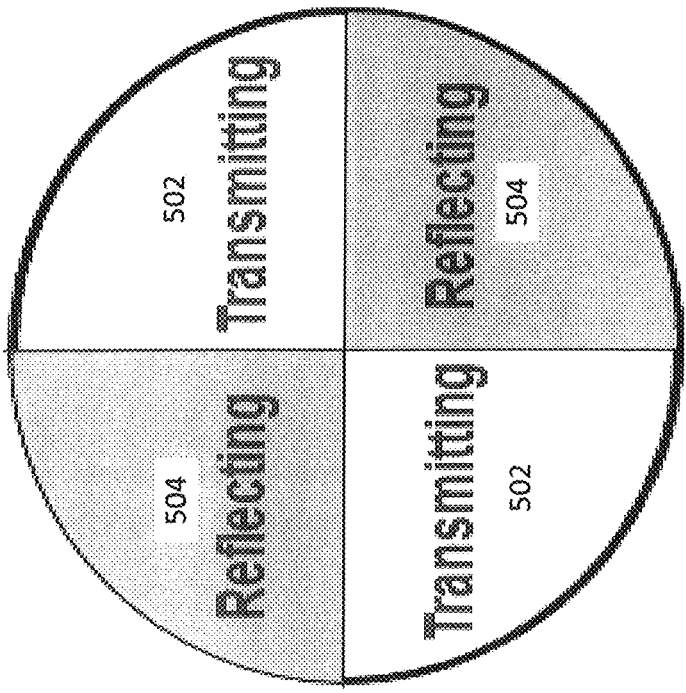

On the other hand, to implement a plate beam splitter where y-dimension information is transmitted and x-dimension information is reflected, the plate beam splitter may utilize the partially-reflecting mirror 410 depicted in FIG. 4B, or the partially-reflecting mirror 420 depicted in FIG. 4C, or the partially-reflecting mirror 500 depicted in FIG. 5A. The partially-reflecting mirror 410 of FIG. 4B has a transmitting region (stripe) 412 along the y-axis and reflecting regions 414 to the right and left of the transmitting region 412. The partially-reflecting mirror 420 of FIG. 4C has a reflecting region (stripe) 424 along the x-axis and transmitting regions 422 above and below the reflecting region 424. The partially-reflecting mirror 500 of FIG. 5A has a first transmitting pie-wedge-shaped region 502 covering from 0 degrees to +90 degrees, a second transmitting pie-wedge-shaped region 502 covering from +180 degrees to +270 degrees, a first reflecting pie-wedge-shaped region 504 covering from +90 degrees to +180 degrees and a second transmitting pie-wedge-shaped region 504 covering from +270 degrees to +360 degrees.

An advantage of this invention is that the optical paths of the diffraction beams originating from wafer alignment marks with different orientations are separated with some of the optical adjustments being independent. The separate optical paths allow the ±1 beams to be focused by each lens L2 (i.e., each of L2a and L2b) to the center of the focal plane. This simplifies alignment and decreases the sensitivity to lens aberrations compared to the use of wedge prisms and their asymmetric beam paths in the prior art. Another advantage over previous implementations that depended on long optical paths and individually positioned mirrors or reflecting prisms to separate the beams from different grating orientations is the more compact design enabled by the beam splitter which allows the use of this design where space is limited.

In the above description, numerous specific details are given to provide a thorough understanding of embodiments of the invention. However, the above description of illustrated embodiments of the invention is not intended to be exhaustive or to limit the invention to the precise forms disclosed. One skilled in the relevant art will recognize that the invention can be practiced without one or more of the specific details, or with other methods, components, etc. In other instances, well-known structures or operations are not shown or described in detail to avoid obscuring aspects of the invention. While specific embodiments of, and examples for, the invention are described herein for illustrative purposes, various equivalent modifications are possible within the scope of the invention, as those skilled in the relevant art will recognize.

These modifications can be made to the invention in light of the above detailed description. The terms used in the following claims should not be construed to limit the invention to the specific embodiments disclosed in the specification and the claims. Rather, the scope of the invention is to be determined by the following claims, which are to be construed in accordance with established doctrines of claim interpretation.

What is claimed is:

1. An apparatus comprising:
    a laser source for generating an incident laser beam which is directed to a two-dimensional target grating on a target substrate such that multiple diffracted beams are created;
    a beam splitter for transmitting a first plurality of the multiple diffracted beams onto a first optical path and directing a second plurality of the multiple diffracted beams onto a second optical path;
    a first reference grating in the first optical path;
    a first detector beyond the first reference grating in the first optical path;
    a second reference grating in the second optical path; and
    a second detector beyond the second reference grating in the second optical path.

2. The apparatus of claim 1 further comprising:
    a collection lens for receiving and collimating the multiple diffracted beams from the two-dimensional target grating.

3. The apparatus of claim 1 further comprising:
    a first selection aperture in the first optical path for selecting the first plurality of the multiple diffracted beams; and
    a second selection aperture in the second optical path for selecting the second plurality of the multiple diffracted beams.

4. The apparatus of claim 1 further comprising:
a first focusing lens in the first optical path for focusing the first plurality of the multiple diffracted beams onto the first reference grating; and
a second focusing lens in the second optical path for focusing the second plurality of the multiple diffracted beams onto the second reference grating.

5. The apparatus of claim 1 further comprising:
a first detector aperture between the first reference grating and the first detector; and
a second detector aperture between the second reference grating and the second detector.

6. The apparatus of claim 5 further comprising:
a first collimating lens between the first detector aperture and the first detector; and
a second collimating lens between the second detector aperture and the second detector.

7. The apparatus of claim 1 further comprising:
a folding mirror which deflects the second plurality of the multiple diffracted beams onto a portion of the second optical path which is parallel to the first optical path.

8. The apparatus of claim 1 further comprising:
source collimating lenses for collimating the incident laser beam from the laser source;
a steering lens for receiving the incident laser beam from the source collimating lenses; and
mirrors for deflecting the incident laser beam onto the two-dimensional target grating.

9. The apparatus of claim 1, wherein the beam splitter comprises a partially-mirrored plate beam splitter.

10. The apparatus of claim 9, wherein the partially-mirrored plate beam splitter comprises a transmitting region which transmits the first plurality of the multiple diffracted beams and reflecting regions adjacent to the transmitting region which reflects the second plurality of the multiple diffracted beams.

11. The apparatus of claim 9, wherein the partially-mirrored plate beam splitter comprises a reflecting region which reflects the second plurality of the multiple diffracted beams and transmitting regions adjacent to the reflecting region which transmits the first plurality of the multiple diffracted beams.

12. A method of measuring alignment of a target substrate, the method comprising:
generating an incident laser beam which is directed to a two-dimensional target grating on the target substrate such that multiple diffracted beams are created;
transmitting a first plurality of the multiple diffracted beams onto a first optical path;
deflecting a second plurality of the multiple diffracted beams onto a second optical path;
focusing the first plurality of the multiple diffracted beams onto a first reference grating which generates a first diffraction; and
focusing the second plurality of the multiple diffracted beams onto a second reference grating which generates a second diffraction.

13. The method of claim 12 further comprising:
detecting an intensity of the first diffraction at a first detector to measure alignment in a first dimension; and
detecting an intensity of the second diffraction at a second detector to measure alignment in a second dimension.

14. The method of claim 13, wherein the first diffraction is a central diffraction due to the first reference grating, and wherein the second diffraction is a central diffraction due to the second reference grating.

15. The method of claim 12 further comprising:
selecting the first plurality of the multiple diffracted beams using a first selection aperture in the first optical path; and
selecting the second plurality of the multiple diffracted beams using a second selection aperture in the second optical path.

16. The method of claim 12 further comprising:
deflecting the second plurality of the multiple diffracted beams onto a portion of the second optical path which is parallel to the first optical path.

17. The method of claim 12, further comprising:
using a beam splitter to transmit the first plurality of the multiple diffracted beams and deflect the second plurality of the multiple diffracted beams.

18. The method of claim 17, wherein the beam splitter comprises a partially-mirrored plate beam splitter.

19. An alignment measurement system comprising:
a two-dimensional target grating on a target substrate, wherein the target grating has features spaced apart periodically along two dimensions;
a laser source for generating an incident laser beam which is directed to the two-dimensional target grating such that multiple diffracted beams are created;
a beam splitter for transmitting a first plurality of the multiple diffracted beams onto a first optical path and directing a second plurality of the multiple diffracted beams onto a second optical path;
a first reference grating in the first optical path;
a first detector beyond the first reference grating in the first optical path;
a second reference grating in the second optical path; and
a second detector beyond the second reference grating in the second optical path.

20. The alignment measurement system of claim 19 further comprising:
a first selection aperture in the first optical path for selecting the first plurality of the multiple diffracted beams; and
a second selection aperture in the second optical path for selecting the second plurality of the multiple diffracted beams.

* * * * *